(12) United States Patent
Bour et al.

(10) Patent No.: US 7,872,272 B2
(45) Date of Patent: Jan. 18, 2011

(54) NITRIDE SEMICONDUCTOR ULTRAVIOLET LEDS WITH TUNNEL JUNCTIONS AND REFLECTIVE CONTACT

(75) Inventors: David P Bour, Cupertino, CA (US); Christopher L Chua, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 209 days.

(21) Appl. No.: 12/337,475

(22) Filed: Dec. 17, 2008

(65) Prior Publication Data

US 2009/0090932 A1    Apr. 9, 2009

Related U.S. Application Data

(63) Continuation-in-part of application No. 11/962,861, filed on Dec. 21, 2007, which is a continuation-in-part of application No. 11/516,333, filed on Sep. 6, 2006, now Pat. No. 7,714,340.

(51) Int. Cl.
*H01L 33/00* (2010.01)
*H01L 29/22* (2006.01)
*H01L 29/227* (2006.01)

(52) U.S. Cl. .......... 257/98; 257/E21.002; 257/E33.066; 438/29; 438/294

(58) Field of Classification Search .............. 257/98, 257/E21.002, E33.068; 438/29, 294
See application file for complete search history.

(56) References Cited

U.S. PATENT DOCUMENTS

| 6,618,413 | B2* | 9/2003 | Bour et al. | 372/45.01 |
|---|---|---|---|---|
| 7,078,735 | B2* | 7/2006 | Shono et al. | 257/98 |
| 7,119,372 | B2* | 10/2006 | Stokes et al. | 257/79 |
| 7,714,340 | B2* | 5/2010 | Chua et al. | 257/98 |
| 2007/0012937 | A1* | 1/2007 | Liu et al. | 257/99 |
| 2010/0207096 | A1* | 8/2010 | Tang et al. | 257/13 |

* cited by examiner

*Primary Examiner*—Fernando L Toledo
(74) *Attorney, Agent, or Firm*—Marger Johnson & McCollom, P.C.

(57) ABSTRACT

A structure and method for improving UV LED efficiency is described. The structure utilizes a tunnel junction to separate a P-doped layer of the LED from a n-doped contact layer. The n-doped contact layer allows the use of a highly reflective, low work function metal, such as aluminum, for the p-side contact. The reflectivity at the contact can be further improved by including a phase matching layer in some areas between the contact metal (The metal above the phase matching layer does not necessarily need to have a low work function because it does need to form an ohmic contact with the n-contact layer) and the n-doped contact layer.

20 Claims, 7 Drawing Sheets

US 7,872,272 B2

NITRIDE SEMICONDUCTOR ULTRAVIOLET LEDS WITH TUNNEL JUNCTIONS AND REFLECTIVE CONTACT

CROSS-REFERENCE TO RELATED APPLICATIONS

This application is a continuation-in-part of U.S. patent application Ser. No. 11/962,861 entitled Light Emitting Devices With An Electrically Active Top Reflector Contact, filed Dec. 21, 2007 which itself is a continuation-in-part of U.S. patent application Ser. No. 11/516,333 entitled Improved Nitride Light-Emitting Device, filed on Sep. 6, 2006, now U.S. Pat. No. 7,714,340 both applications hereby incorporated by reference in their entireties.

BACKGROUND

State of the art ultraviolet (UV) nitride semiconductor light-emitting diodes (LEDs) are relatively inefficient compared to their visible counterparts. The inefficiency is due a number of factors including (1) lower internal quantum efficiencies (a lower probability that an injected carrier is converted to a UV photon by radiative recombination) and 2) poor extraction efficiency (only a small fraction of UV photons are successfully extracted from the chip rather than being lost to internal absorption in the LED structure). In order to realize high efficiency LEDS, both of these issues need to be addressed. However the potential gain from improving extraction efficiency is likely to be greater and simpler to accomplish than the gains from improving internal efficiency.

Improving light extraction in a nitride LED is difficult due to the constraints associated with forming an electrode on a p-type semiconductor. These difficulties are described in H. Hirayama, "Quartenranry InAlGaN-based high-efficiency UV LEDs", Journal of Applied Physics, 97, 091101 (2005). Specifically, high-work-function metals (e.g., nickel, chromeAg is a low work-function material, some rare-earth metals such as palladium and ruthenium, nickel-gold composites etc.) which are known to form good ohmic contacts with semiconductors are optically absorbing in the ultraviolet portion of the spectrum. Thus nitride LEDs typically remove light from the top (p-side)

In contrast, for visible nitride LEDs, contact metallurgies with very high reflectivity have been developed. The high reflectivities along with surface-texturing have enabled extraction efficiencies approaching 80% in visible wavelength LEDs. An analogous high reflectivity contact for UV LEDs would greatly improve UV LED performance and enable UV LEDs where light is removed from the bottom.

Thus a highly reflective p-side contact for UV LEDs is needed.

SUMMARY

A structure and method for an improved p-side contact for a light emitting diode is described. The system utilizes a tunnel junction to separate the p-doped region of a light emitting diode from a n-contact layer. The n-contact layer enables the use of metal contacts that are highly reflective at UV wavelengths as a p-side contact. Such metal contacts thereby serve the dual purpose of both providing electrical current and redirecting light generated in the light emitting diode active region towards a desired output direction. The reflectivity of the metal contact may also be further enhanced by including a phase matching layer between portions of the metal contact and the n-contact layer.

DETAILED DESCRIPTION

Figure 1:
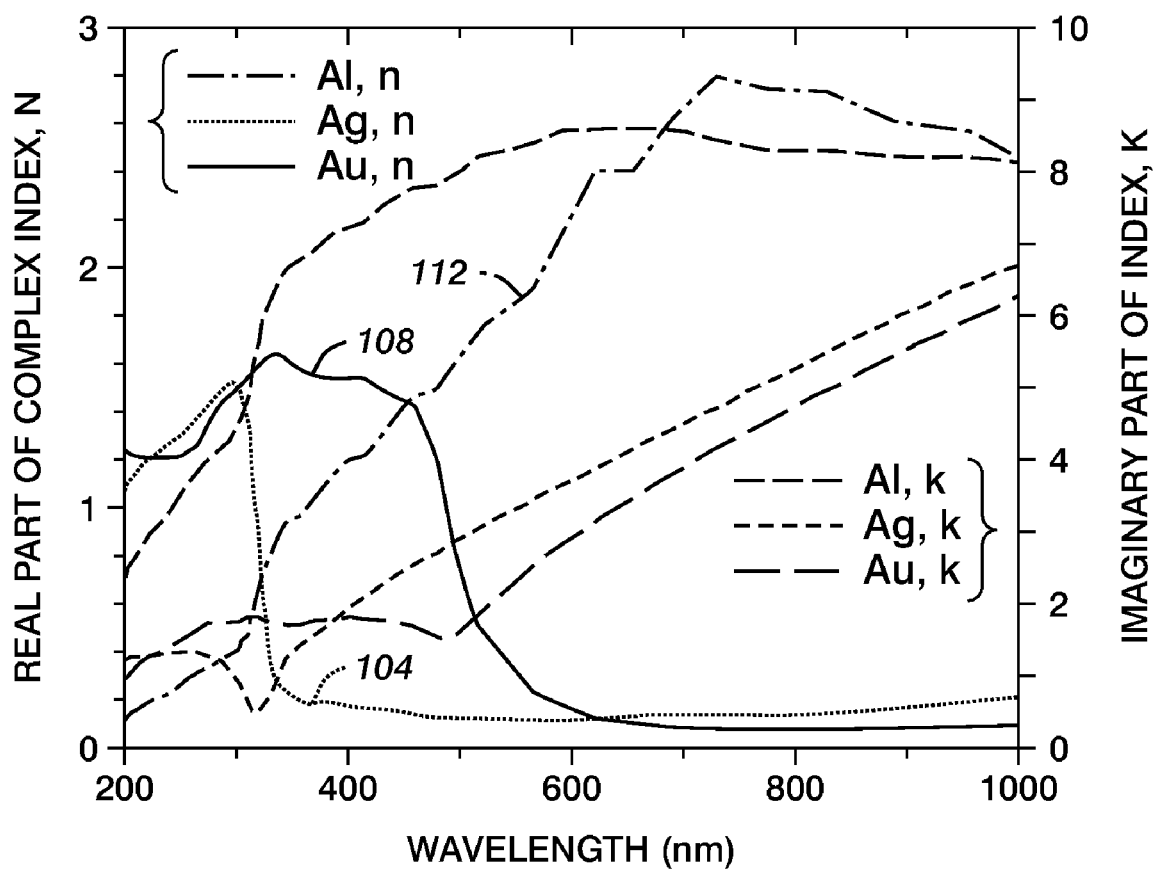
FIG. 1 shows a plot of the index of refraction for gold, silver and aluminum at different wavelengths of light.

Traditional contact metals that form a good contact with the high-bandgap p-type semiconductor (implying a high work function) are typically poor UV reflectors. FIG. 1 illustrates the problem by showing the dispersion of the complex index for gold, silver and aluminum at various wavelengths including the UV, visible and near infrared wavelengths.

The real part of the refractive index (the n-value) determines the reflectivity of a metal at a semiconductor-metal interface. When n is low (n<1), the large index mismatch with respect to the semiconductor makes the metal reflective. In particular, the large index mismatch prevents light from penetrating deeply into the metal and consequently the light experiences little loss and is almost completely reflected.

FIG. 1, plots the real part of the refractive index (the n-value) of select metals as curve 104 for silver, curve 108 for gold and curve 112 for aluminum. Curve 108 shows that gold has a low n value for wavelengths greater then 600 nm, the yellow-red portion of the spectrum. Thus gold is a good reflector for these and longer wavelengths (hence its yellow appearance) but is a poor reflector at shorter visible and UV wavelengths. Silver curve 104 has a low n-value throughout the visible spectrum (400-700 nm) and is thus commonly used as a reflector for visible LEDs. However, silver reflectivity is poor at UV wavelengths (wavelengths shorter than 350 nm). Aluminum's low n-value throughout the 200 nm band makes it a promising UV reflector.

Although a good reflector, aluminum has a relatively low work function of 4.28 eV. As used herein, low work function materials are defined to be materials with a work function below 4.55 eV. Typically, high-work function metals (as used herein, defined to be metals with a work-function exceeding 4.55 eV such as nickel, chrome, gold and some rare earth metals and composites are used to make good ohmic p-doped semiconductor contacts. Unfortunately, these metals are absorbing at UV wavelengths and thus make poor reflectors. Although having excellent reflectivity in the UV range, low work function metals such as Aluminum do not form a good ohmic contact to p-type nitride semiconductors and thus are not typically used for this purpose. Thus a method of using low work function metals such as Aluminum as a p-side contact and a reflector in a UV system is needed.

Figure 2:
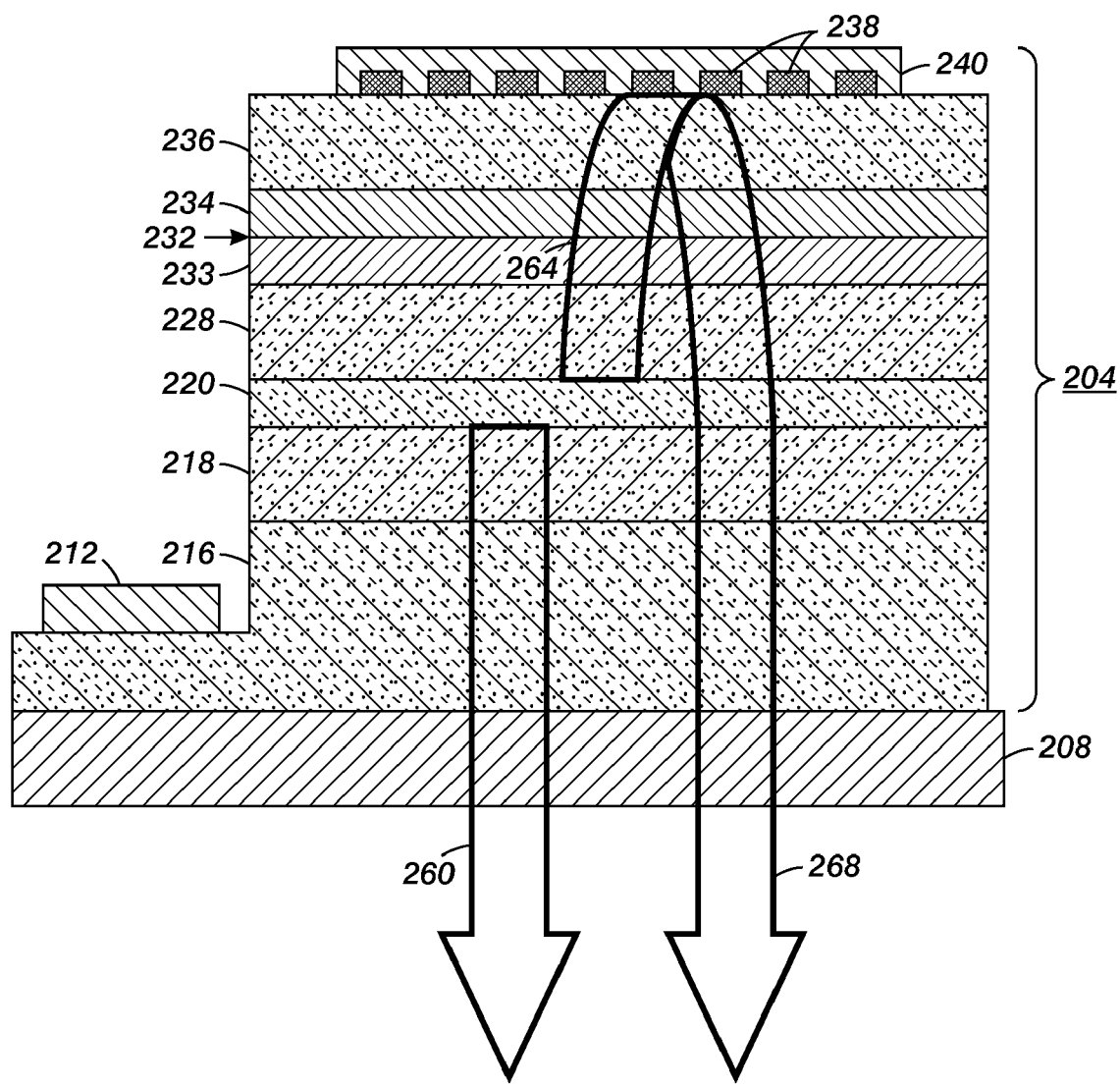
FIG. 2 shows a UV LED structure including a tunnel junction, a highly reflective top electrode and an optional phase matching layer.

FIG. 2 shows an example UV LED structure 204 grown on a sapphire substrate 208. In the illustrated embodiment, aluminum serves both as an electrical P-side contact to provide current and as a reflector to increase light extraction efficiency. The LED structure also includes a n-contact electrode 212 coupled to an N-doped current spreading layer 216. A N-doped cladding layer 218 is formed over current spreading layer 216. Active region 220, formed over cladding layer 218, includes multiple quantum wells that emit UV light having a wavelength between 230 nm and 410 nm.

Over active region 220, a novel structure including a p-doped layer 228, a tunnel junction 232, a n-type contact layer 236, an optional phase matching layer 238, and a high reflectivity contact electrode 240 is formed. Tunnel junction 232 separates the p-doped layer 228 from the n-type contact layer 236. As used herein, p-doped layer 228 may include a p-doped current injection layer as well as an optional p-doped cladding layer. Typically, the tunnel junction includes very highly doped (degenerate) semiconductors. In one example, the n-side of the tunnel junction is doped with a concentration of approximately $1 \times 10^{20}$ donors per cubic centimeter while the p-side of the tunnel junction is doped with a concentration of approximately $1 \times 10^{20}$ acceptors per cubic centimeter.

During laser operation, active region 220 is forward biased to output light. At the same time, the tunnel junction is reverse biased to produce a tunneling current across the junction. Although theoretically, the reverse bias voltage may be less than 0.5 volts, more typically a reverse bias voltage of approximately 1 volt is applied.

Figure 3:
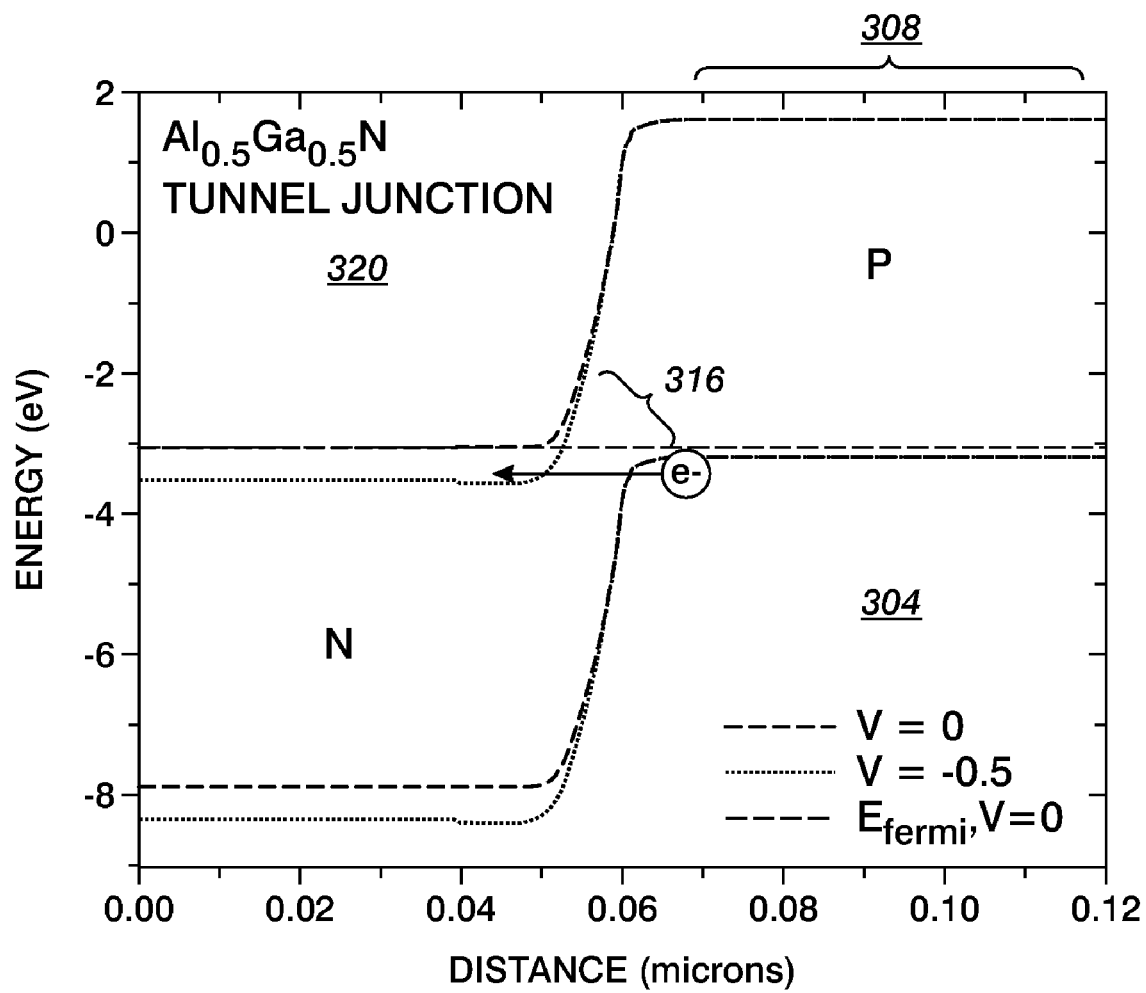
FIG. 3 shows a band diagram of the tunnel junction of FIG. 2.

The application of the reverse bias produces a band diagram approximately of the type shown in FIG. 3. As electrons in top states at the top of the valence band 304 in the p-doped region 308 of the AlGaN tunnel shift across the gap 316, to electron states in the conduction band 320 of the n-AlGaN. The shift converts the electron current injected from contact electrode 240, through n-type contact layer 236 into a hole current needed for injection across active region 220.

The hole current through active region 220 resulting in emissions of UV light. A first portion of the UV light 260 is transmitted through the n doped cladding layer 220 and exits the LED through the substrate. However, a second portion of UV light 264, approximately half of the light generated in active region 220, initially propagates through the p-doped layer 228. The light passes through the tunnel junction 232 and is reflected at contact electrode 240. Contact electrode 240 typically reflects at least 20% of the incident UV light. As will be further explained in the description of FIG. 4, the amount of UV light reflected may be increased by the inclusion of optional phase matching layer 238. The reflected UV 268 propagates back through the entire LED structure including the tunnel junction 232, the p cladding layer 228, the active region 220 and the n cladding layer 220 before being extracted from the UV LED structure.

With the illustrated tunnel-junction structure, an additional benefit can be obtained by spreading current using the high electrical conductivity of the n-type contact layer. Usually, the n-type material is approximately 100 times more conductive than p-type material. The high conductivity dramatically improves lateral current spreading. Improved lateral current spreading allows inclusion of additional insulating phase matching layers between portions of the metal contact and the n-type contact layer. The phase matching layers are designed to further increase reflectivity of incident UV light.

Figure 4:
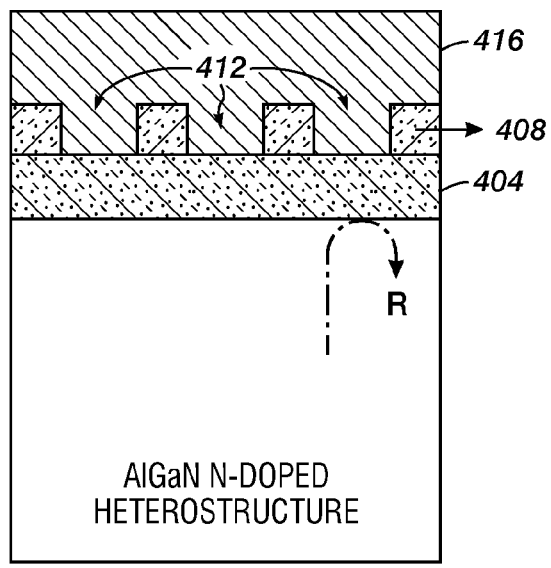
FIG. 4 shows a cross sectional schematic of a mesh metal contact/reflector and a dielectric phase matching layer.

FIG. 4 shows an example of an insulating phase matching layer. In one embodiment, an insulating phase matching layer 408 such as a silicon oxide, is deposited over the n-type contact layer 404. The n-type contact layer may be a GaN contact layer. Patterning the phase matching layer 408 with openings 412 allows metal contact 416 to make a direct ohmic contact with n-type contact layer 404. The resulting contact resembles a mesh electrical contact contacting n-type contact layer 404.

Figure 5:
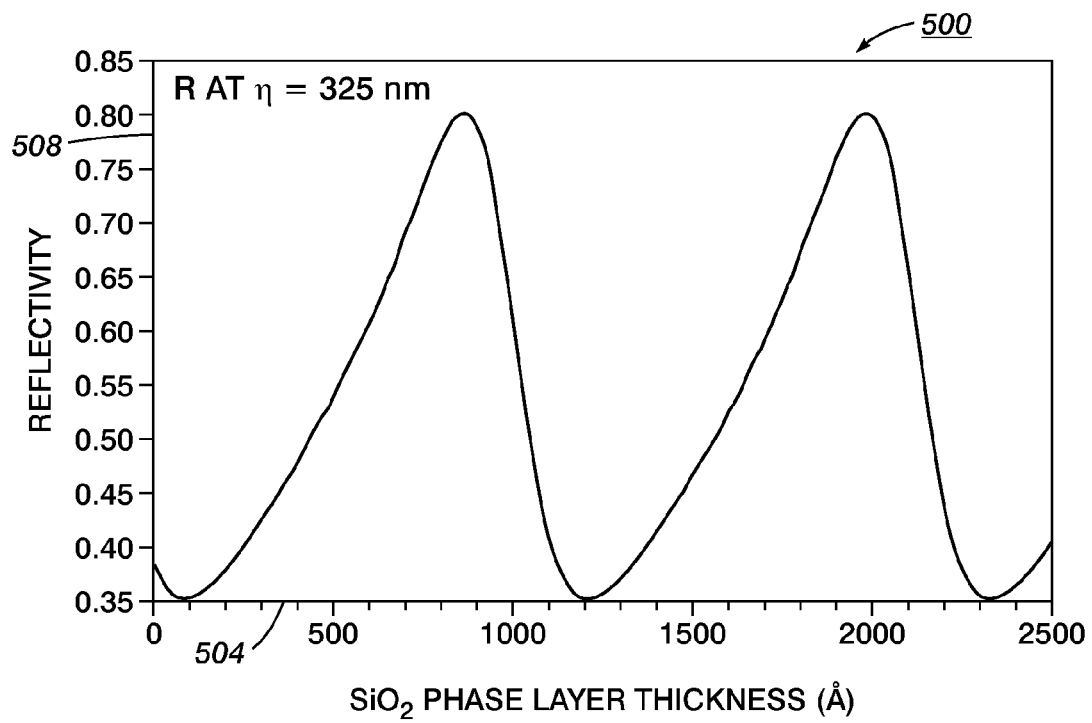
FIG. 5 shows a graph of the reflectivity as a function of the thickness of a phase matching layer.

Phase matching layer 408 further improves reflectivity of incident UV light upon the contact. FIG. 5 shows a graph of the reflectivity as a function of the phase matching layer thickness. The graph of FIG. 5 assumes 325 nm wavelength UV light generated in a UV LED active layer incident on a silicon oxide phase matching layer and a 300 nm aluminum contact/reflector 416. In the absence of a phase matching layer (thus a continuous metal over the GaN contact layer), the reflectivity is approximately 39%. Depending on the phase matching layer thickness as indicated on axis 504, the reflectivity as shown on axis 508 changes in a periodic manner. Typically, an approximate optimum phase matching layer thickness to maximize reflectivity can be computed from using Maxwell's equation and matching interface electric field boundary conditions. In the illustrated example, the optimum phase-matching layer thickness occurs at 86 nm or 200 nm of silicon oxide where the reflectivity of the phase matching layer improves to almost 80%.

Maximizing the area covered by the phase-matching layer maximizes the overall reflectivity of light in the n-type contact layer. However, increasing the phase-matching layer area coverage minimizes the metal fill factor. A reduced metal fill factor results in an inferior electrical contact between the metal and the n-type contact layer. As used herein, the metal fill factor is defined as the percentage of the area in which the metal directly contacts or otherwise forms an ohmic contact with the n doped contact layer compared to the total contact area possible in the absence of a phase matching layer. (Thus the total possible contact area is the typically the sum of the metal contact area with the n-type contact layer and the dielectric phase matching layer contact area with the n-type contact layer). In particular, reducing metal fill factor results in non-uniform current injections.

Figure 6:
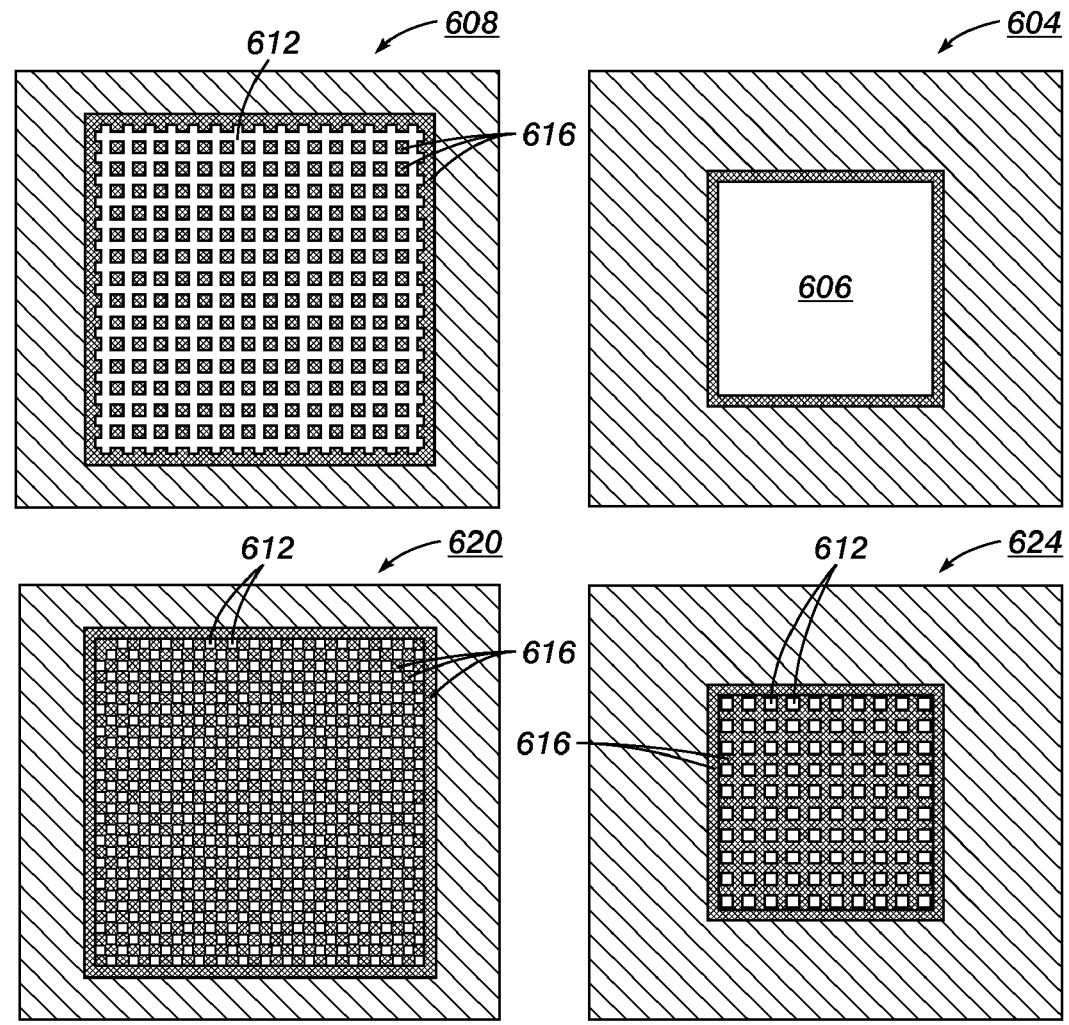
FIG. 6 shows various fill factors of a contact including the phase matching layer.

The optimum fill factor balances improved reflectivity with uniform current distribution and typically takes into account circuit design considerations. FIG. 6 shows a number of different possible fill factors. Contact 604 representing a 100% metal fill factor where contact metal 606 covers the entire possible contact area. Contact 608 shows a 75% fill factor where metal 612 covers 75% of the contact layer and phase-matching dielectric 616 covers 25%. Contact 620 shows a 50% fill factor and might be considered a typical compromise. Contact 624 shows a 25% fill factor where metal 612 covers 25% of the contact layer and phase-matching dielectric 616 covers 75%.

Figure 7:
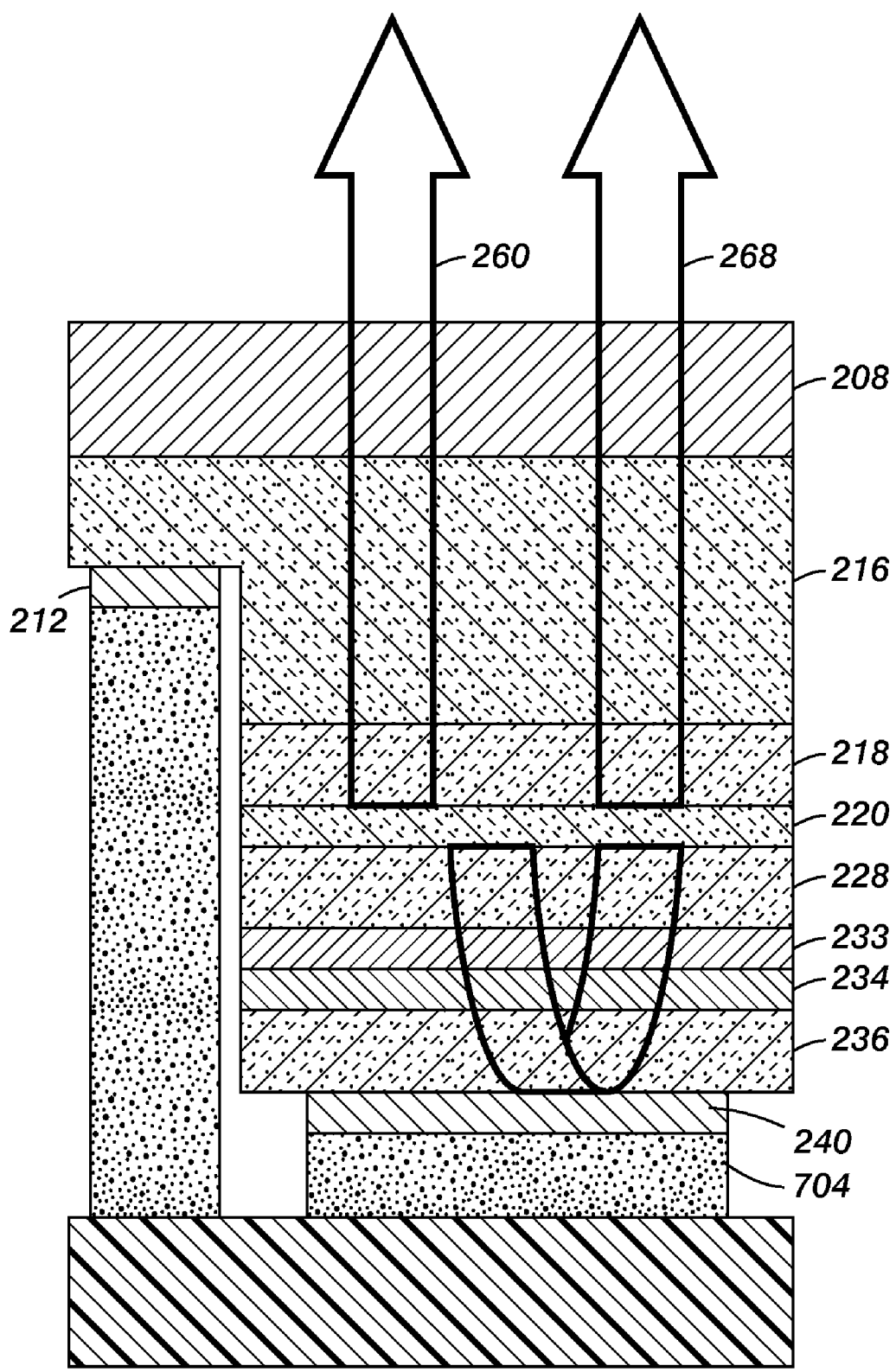
FIG. 7 shows a flip chip implementation of a UV led.

Although the specification describes a basic UV LED structure with a tunnel junction and aluminum top electrode and the light exiting through the substrate as shown in FIG. 2, the design should not be limited to the illustrated implementation. FIG. 7 shows a flip chip structure where the highly reflective contact electrode is mounted to a metal solder bond 704. The metal solder bond couples to a submount 708 or other heat sink to improve heat dissipation of the UV LED structure.

Figure 8:
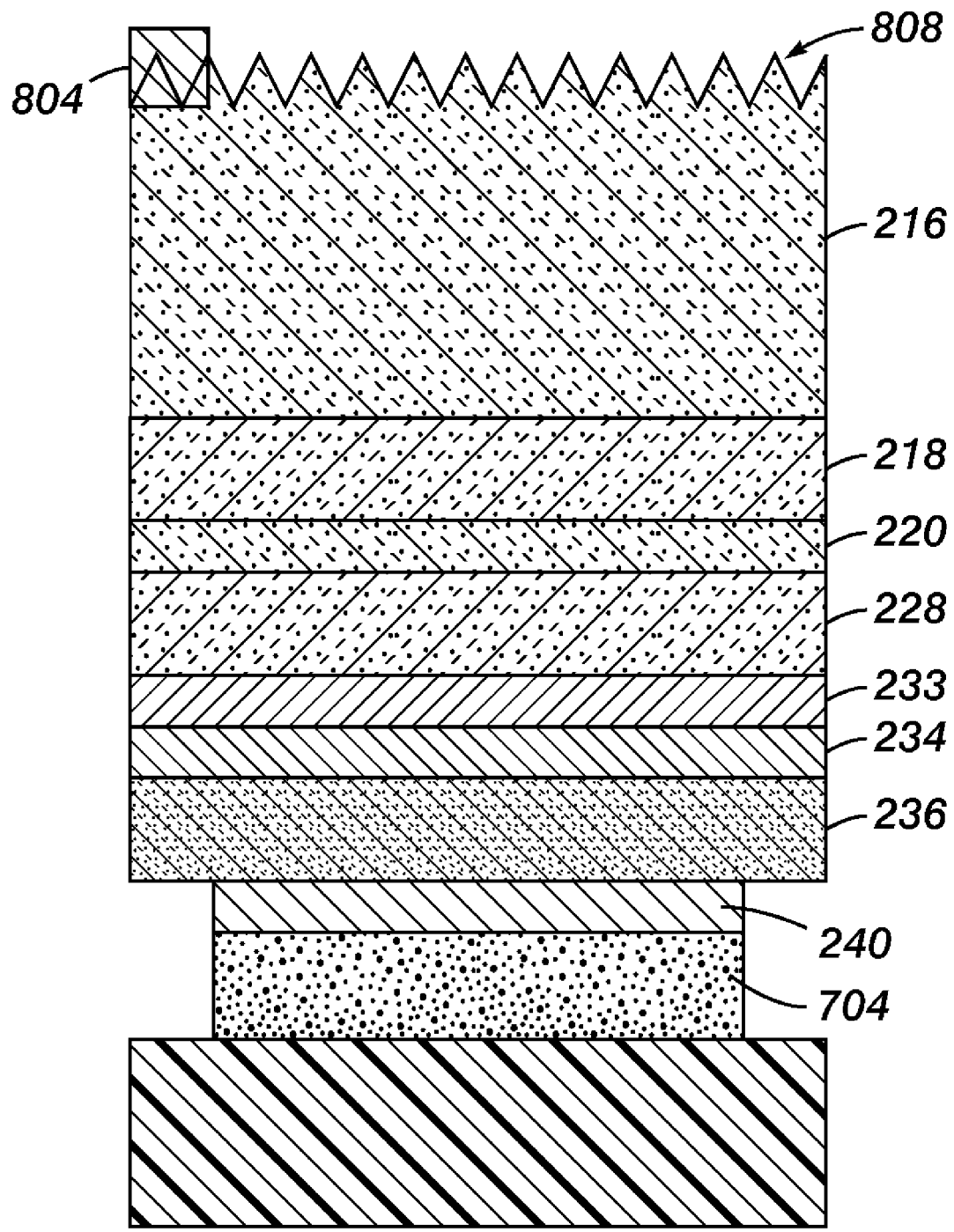
FIG. 8 shows a flip chip implementation with a textured backside to further improve light extraction efficiency.

FIG. 8 shows a flip chip design of the previous FIG. 7 wherein the sapphire substrate has been removed. Various techniques, such as laser lift off as described in U.S. Pat. No. 6,455,340, entitled "Method of fabricating GaN semiconductor structures using laser-assisted epitaxial liftoff" by Chua et al. and which is hereby incorporated by reference may be used to facilitate substrate removal. In FIG. 7, the n-doped cladding layer has been textured 808 to reduce reflectivity at the cladding layer air interface. A n-type contact 804 has been positioned at a corner of the n-cladding layer to provide current to the LED structure.

Although substantial details have been provided in the above description, it should be understood that such details are provided to facilitate understanding of the invention. The above details should not be used to unduly limit the invention as other embodiments are also contemplated and possible. Instead, the invention should only be limited by the claims as originally presented below, and as they may be amended, to encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. An AlGaN light emitting diode to output ultraviolet light having a wavelength between 230 nm and 410 nm comprising:
   an active region to output UV light between a n-doped region and a p-doped region;
   a tunnel junction separating the p-doped region from an n-doped contact region; and,
   a metal contact coupled to the n-doped contact region, the metal contact having a reflectivity exceeding 20% at the wavelength of operation, the metal contact to provide current to the active region and to reflect the UV light generated from the active region back into the active region to significantly improve the extraction efficiency of the light emitting diode.

2. The light emitting diode of claim 1 wherein the active region includes AlGaN.

3. The light emitting diode of claim 1 wherein the tunnel junction is reverse biased during operation of the light emitting diode.

4. The light emitting diode of claim 1 wherein the work function of the metal contact is between 2.5 eV and 4.55 eV.

5. The light emitting diode of claim 4 wherein the metal contact is aluminum.

6. The light emitting diode of claim 4 wherein the metal contact is silver.

7. The light emitting diode of claim 1 further comprising a second metal contact coupled to the n-doped region wherein both the first metal contact and the second metal contact are formed from aluminum.

8. The light emitting diode of claim 1 further comprising a second metal contact coupled to the n-doped region wherein both the first metal contact and the second metal contact are formed from silver.

9. The light emitting diode of claim 1 further comprising:
   a phase matching layer between at least a portion of the metal contact and the n-doped contact region, the phase matching layer to further improve the reflectivity of the ultraviolet light output by the light emitting diode.

10. The light emitting diode of claim 9 wherein the phase matching layer is made of a dielectric.

11. The light emitting diode of claim 10 wherein the phase matching layer is silicon oxide.

12. The light emitting diode of claim 9 wherein the fill factor of the metal contact is between 25% and 75%.

13. The light emitting diode of claim 9 wherein the reflectivity at the interface of the n-doped contact layer and the phase matching layer exceeds 50% at the frequency output by the light emitting diode.

14. The light emitting diode of claim 9 wherein the phase matching layer is made of a dielectric and the metal contact is made of aluminum.

15. The light emitting diode of claim 9 wherein the phase matching layer is made of a dielectric and the metal contact is made of silver.

16. An light emitting diode to output ultraviolet light comprising:
   an first aluminum contact;
   a n-doped current spreading layer coupled to the first aluminum contact, the n-doped current spreading layer to spread current;
   an active region coupled to receive current from the n-doped current spreading layer, the active region to output light;
   a cladding layer formed over the active region;
   a p-doped current injection layer formed over the active region;
   a tunnel junction that separates the n-doped current spreading layer from the p-doped current injection layer; and,
   a second contact coupled to the n-doped contact layer; the second contact to receive current from the first aluminum contact, the second contact also to reflect light output from the active region.

17. The light emitting diode of claim 16 wherein the active region includes AlGaN.

18. The light emitting diode of claim 16 wherein the second aluminum contact reflects at least 75% of the light from the active region that is incident on the second aluminum contact back into the light emitting diode.

19. The light emitting diode of claim 16 further comprising:
   a phase matching layer between at least a portion of the second aluminum contact and the n-doped contact layer.

20. The light emitting diode of claim 19 wherein a fill factor of the second aluminum contact is between 25% and 75%.

* * * * *